United States Patent [19]

Sondergeld et al.

[11] Patent Number: 4,987,054
[45] Date of Patent: Jan. 22, 1991

[54] PHOTOPOLYMERIZABLE COMPOSITIONS WITH BINDERS CONTAINING CARBOXYL GROUPS

[75] Inventors: Manfred Sondergeld, Muhlheim/Main; Jonathan W. Goodin, Neu-Isenburg, both of Fed. Rep. of Germany

[73] Assignee: E. I. Du Pont de Nemours and Company, Wilmington, Del.

[21] Appl. No.: 318,148

[22] Filed: Mar. 1, 1989

[30] Foreign Application Priority Data

Apr. 29, 1988 [DE] Fed. Rep. of Germany ....... 3814567

[51] Int. Cl.$^5$ .................. G03C 1/77; G03F 7/037
[52] U.S. Cl. .................... 430/275; 430/281; 430/283; 430/288; 430/906; 430/271; 522/107; 522/126; 522/182
[58] Field of Search ............ 430/906, 275, 281, 288, 430/283, 271; 522/107, 126, 182; 525/327.6

[56] References Cited

U.S. PATENT DOCUMENTS

| | | | |
|---|---|---|---|
| 2,313,565 | 3/1943 | McDowell et al. | 525/327.6 |
| 2,402,604 | 6/1946 | Coffman | 525/327.6 |
| 3,684,777 | 8/1972 | Field et al. | 525/327.6 |
| 3,873,319 | 3/1975 | Berg | 430/288 |
| 4,284,707 | 8/1981 | Nagasawa | 430/281 |
| 4,775,597 | 10/1988 | Birkmeyer et al. | 522/107 |
| 4,868,246 | 9/1989 | Macleay et al. | 525/327.6 |

FOREIGN PATENT DOCUMENTS 7508853 11/1976 France .
61-41141 2/1986 Japan ................... 430/283

Primary Examiner—Marion E. McCamish
Assistant Examiner—Christopher D. RoDee

[57] ABSTRACT

Photopolymerizable compositions for image recording, containing, among other components, addition-polymerizable, ethylenically unsaturated compounds and polymeric binders, wherein at least one of these binders is a copolymer of the formula (I) containing 5 to 50 percent by weight of one or more different structural units C1, C2, or combinations thereof containing carboxyl groups.

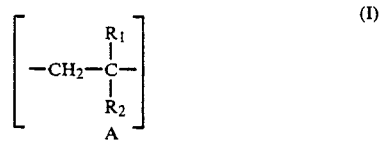

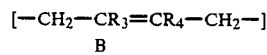

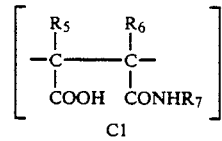

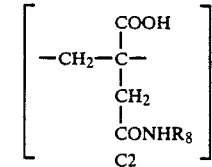

8 Claims, No Drawings

PHOTOPOLYMERIZABLE COMPOSITIONS WITH BINDERS CONTAINING CARBOXYL GROUPS

BACKGROUND OF THE INVENTION

The invention involves photopolymerizable compositions for image recording, containing an addition-polymerizable, ethylenically unsaturated compound, a photoinitiator or a photoinitiator system and at least one polymeric binder, wherein at least one of these binders is made from a copolymer of, respectively, one or more different structural units A and B and at least one additional structural unit containing carboxyl groups. Photopolymerizable compositions are extensively used in image recording materials, particularly in the production of photoresists, solder resists and printing plates.

Photopolymerizable resist materials are known, for example, from U.S. Pat. Nos. 3,469,982 and 3,547,730, which describe a film resist with a sandwich structure in the form of a photopolymerizable layer between a cover sheet and a temporary support. This film resist can, for example, be laminated on a copper base, exposed imagewise and developed, whereby a resist layer is formed.

The resist layer thus produced can now be selectively etched, electroplated or treated with solder on the substrate. Particularly high demands are placed on photoresist films if they are used as solder resists. In this case, the developed, photopolymerized layer must withstand temperatures up to 300° C. According to the current state of the art, such solder resists can be made by spraying, coating or calendering liquid compositions on a substrate or also by laminating a dry film on a substrate.

The described photoresist films consist usually of a temporary or permanent support, a photopolymerizable layer, which contains a polymeric binder, addition-polymerizable compounds and a photoinitiator, and a cover layer. After imagewise exposure and optionally, after lamination on a substrate, the cover layer can be removed and the photopolymerizable layer can be developed. Many photopolymerizable compositions can be developed with organic solvents, many with aqueous solutions.

Frequently, the polymeric binders of such photopolymerizable image recording materials, particularly those that are aqueous-developable, contain acid functions, primarily carboxyl functions. However, these groups are disadvantageous in many processing steps. In the case of photoresists, delamination of the resist is observed in alkali etching or gold plating, in the case of solder resists, inadequate moisture and insulation properties.

In particular, completely aqueous developable photopolymer systems with high wash-off rates and, in some cases, rapid stripping behavior, show, because of their hydrophilic properties, weaknesses in other processing steps, for example, narrow development latitude, stripping in alkali etching and in gold plating or inadequate climatic resistance.

In the field of photoresists, modification of the carboxyl groups with melamine compounds to overcome the named disadvantages is known (EP 01 15 354 and U.S. Pat. No. 4,247,621). However, the addition of the melamine compounds can decrease the light sensitivity of the photopolymerizable compositions, so that such compositions require longer exposure times. Furthermore, many of these compounds tend to crystallize on long storage of the photopolymerizable compositions, so that recording materials prepared therefrom cannot be used.

SUMMARY OF THE INVENTION

The problem in the present invention is to make available photopolymerizable compositions based on binders containing carboxyl groups for image recording, the properties of which compositions can be changed by a thermal post-treatment after exposure and development so as to produce resists with improved chemical and physical properties, such as, for example, higher hydrolytic stability and greater mechanical stability in etching systems, in gold plating and soldering. At the same time, the general property profile should not be be affected adversely. Good storage stability, high processing and use latitude and exact reproduction of even the smallest image elements should be imparted to the product.

This problem is solved by photopolymerizable compositions for image recording, containing at least one addition-polymerizable, ethylenically unsaturated compound, a photoinitiator or photoinitiator system and at least one polymeric binder, wherein at least some of these binders is a copolymer made from, respectively, one or more different structural units A and B and at least one additional structural unit containing carboxyl groups.

The invention is characterized in that (I) 5 to 50 percent by weight of the copolymer is formed from one or more different structural units C1 and/or C2 containing carboxyl groups, (II) the proportion of one or more different structural units A is 5 to 95 percent by weight, (III) the proportion of one or more different structural units B is 0 to 50 percent by weight and (IV) A, B, C1 and C2 have the structures

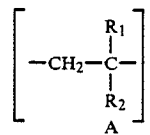

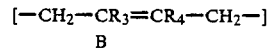

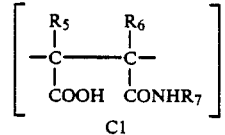

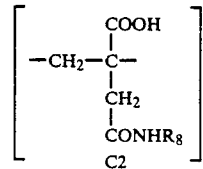

in which $R_1$ = H, $CH_3$, $C_2H_5$, phenyl and alkylphenyl, $R_2$ = H, $CH_3$, phenyl, —$COOR_9$, —$CONR_{10}R_{11}$ and —CN, $R_3$, $R_4$, $R_5$, and $R_6$ = H and alkyl and $R_7$, $R_8$, $R_9$, $R_{10}$ and $R_{11}$ = H, alkyl and aryl, which can be substituted with hydroxy, ester, halogen, keto, ether and/or thioether groups.

DETAILED DESCRIPTION OF THE INVENTION

The photopolymerizable compositions of the invention contain polymeric binders, the structure of which can be modified after exposure and development. These binders consist of, among others, structural units with neighboring carboxyl and amide groups, which, after imagewise exposure and development of the photopolymerizable image recording material, can be converted into hydrophobic imide groups by a thermal post-treatment at 130° to 200° C. Thus, on one hand, good developability is assured by the presence of the carboxyl groups before the thermal treatment, while, on the other hand, the disadvantageous properties of the former carboxyl groups are eliminated by the conversion of these groups into imide groups by a thermal post-treatment.

It was surprising that, by the use of the named polymeric binders in the compositions of the invention for image recording, such resist could be obtained showing improved chemical and physical stability to etching solutions, in gold plating and in soldering, without the properties of the recording material itself being affected. Thus, the photopolymerizable recording materials made according to the invention show, among other properties, good storage stability at room temperature and they are also stable at a laminating temperature of 120° C. This is all the more surprising as the imide groups are formed at a negligible temperature increase in the later thermal post-treatment. Furthermore, it is necessary that the temperature in the thermal post-treatment not be too high and the treatment time not too long, as otherwise the entire photopolymerizable recording material becomes useless.

It is indeed known from DE 25 12 693 to use as polymeric binders the reaction products of styrene-maleic acid anhydride copolymers with dialkyl amines, which results in copolymers with neighboring carboxyl and amide functions; however, because secondary amines are used, a binder is not obtained with properties that can be modified by a thermal post-treatment after exposure and development. Furthermore, in the cited reference, a maximum of two-thirds of the anhydride groups are reacted with amine, as otherwise, an excessive number of carboxyl groups would be introduced and thus would interfere with good adhesion of the light sensitive layer on a metallic substrate during the thermal coating step. Therefore, the expert could not have predicted that the recording materials of the invention, in which no dicarboxylic acid anhydride groups are present, could be laminated without difficulties on a substrate.

EP 00 71 789 describes photopolymerizable resist layers with improved adhesion to the surfaces of metallic substrates. This is attained by the introduction of a certain percentage of amino functions. As these, among others, can be introduced by the reaction of binders containing maleic acid anhydride with aliphatic diamines, neighboring carboxyl and amide functions are also thus obtained as is required in the teaching of the invention. However, diamines are not suitable as reaction components in the sense of the invention's concept, because these cause discoloration of copper even before the thermal posttreatment, their introduction into the binder containing dicarboxylic acid anhydride cannot be controlled, crosslinking can occur and in addition, they can lead to development residues caused by the improved adhesion that they produce.

DD 219 305 describes an alkali-developable, photopolymerizable composition, which can contain as binder, among other compounds, the reaction product of ammonia and a copolymer formed from an unsaturated hydrocarbon, a maleic acid anhydride-urea adduct and maleic acid anhydride. However, like the previously mentioned diamines, a binder containing urea also leads to discoloration of copper. In addition, according to the cited patent, these photopolymerizable compositions are outstanding for good adhesion on polyester supports. However, as an important application of the photopolymerizable compositions of the invention is supposed to be the production of layer transfer materials, binders containing urea adducts are not suitable for this purpose.

In view of the current state of the art, the expert could not expect resists produced with the photopolymerizable compositions of the invention to show improved chemical and physical stability, without the properties of the recording materials themselves being affected adversely.

The binder copolymers essential to the invention are made from, respectively, one or more different structural units A and B and 5 to 50 percent by weight, preferably 10 to 30 percent by weight, of one or more different structural units C1 and/or C2 containing carboxyl groups.

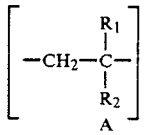

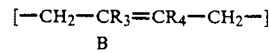

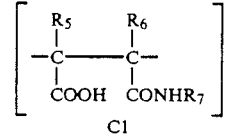

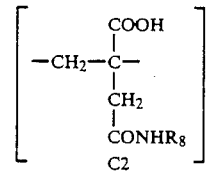

$R_1$ = H, CH$_3$, C$_2$H$_5$, phenyl and alkylphenyl, preferably H and CH$_3$ $R_2$ = H, CH$_3$, phenyl, —COOR$_9$, —CONR$_{10}$R$_{11}$ and -CN, preferably phenyl, COOR$_9$ and CONR$_{10}$R$_{11}$ $R_3$, $R_4$, $R_5$, and $R_6$ = H and alkyl and $R_7$, $R_8$, $R_{10}$ and $R_{11}$ = H, alkyl and aryl, which can be substituted with hydroxy, ester, halogen, keto, ether and/or thioether groups, preferably unsubstituted and hydroxy substituted alkyl and aryl groups.

The proportion of structural units A should be 5 to 95 percent by weight, preferably 10 to 90 percent by weight and the structural units B should be present as 0 to 50 percent by weight, preferably 0 to 30 percent by weight.

The copolymers of the invention can be formed by direct copolymerization as well as by reaction of primary amines with copolymers, which are formed by copolymerization of one or more ethylenically unsaturated dicarboxylic acid anhydrides with one or more comonomers. Suitable ethylenically unsaturated dicarboxylic acid anhydrides in the sense of the invention are, for example, maleic acid anhydride, itaconic acid anhydride and citraconic acid anhydride. The proportion of ethylenically unsaturated dicarboxylic acid anhydrides in the copolymers is 5 to 50 percent by weight, preferably 10 to 30 percent by weight.

Primary aliphatic or aromatic, optionally substituted, amines can be used as amines in the invention. Substituents can be the following functional groups: hydroxy, ester, halogen, keto, ether and/or thioether groups. Propyl amine, butyl amine, aminopropanol, 4methoxyaniline, 4-aminophenol, decyl amine and/or cyclohexyl amine are preferred. Suitable comonomers, which form the structural units A and B of the copolymer essential to the invention, are unsaturated hydrocarbons, such as, for example, ethylene, propylene, substituted styrenes, butadiene and isoprene, and unsaturated carboxylic acids and their derivatives, such as, for example, (meth)acrylic acid, (meth)acrylic acid amides and (meth)acrylates. Methyl methacrylate, methyl acrylate, acrylamide, ethyl acrylate, butyl acrylate, styrene, isoprene and butadiene are preferred. The copolymers of the invention should have a molecular weight greater than 10,000, preferably from 30,000 to 80,000.

The proportion of the copolymer essential to the invention with neighboring carboxyl and amide groups can be up to 100 percent of the entire binder. The quantity of total binder is generally 20 to 90 percent by weight relative to the total components of the mixture.

The following binders can be used, for example, in combination with the binder essential to the invention: polyacrylates, polymethacrylates, styrene polymers and copolymers, polyurethanes, polyesters and polyamides. Copolymers of methyl methacrylate, (meth)acrylic acid or maleic acid half esters with styrene and copolymers of methacrylic acid and alkyl methacrylates are preferred.

Suitable addition polymerizable, ethylenically unsaturated compounds, which can be used alone or in combination with other monomers, include t-butyl acrylate, ethylene glycol diacrylate, 2-hydroxypropyl methacrylate, triethylene glycol diacrylate, trimethylol propane triacrylate and methacrylate, polyoxyethylated trimethylol propane triacrylate and methacrylate, polyoxyethylated trimethylol propane triacrylate, 1,4-diisopropenyl benzene, 1,4-dihydroxybenzene dimethacrylate, decamethylene glycol diacrylate, styrene, diallyl fumarate, lauryl acrylate, methacrylamide or xylylene-bis-acrylamide.

The total quantity of monomers in the photopolymerizable compositions is 10 to 80 percent by weight relative to the total components of the mixtures.

As photoinitiators or photoinitiator system in the photopolymerizable compositions of the inventions, practically all compounds known for this purpose can be used; examples are 9-phenyl acridine, 9,10-dimethylbenz(a)phenazine, benzophenone/Michler's ketone, hexaaryl bis-imidazole/mercaptobenzoxazole, benzil dimethyl ketal, thioxanthone/amines. The photoinitiators are generally used in a quantity of 0.01 to 10 percent by weight.

The photopolymerizable compositions and the image recording materials prepared therefrom can contain further additives, such as, for example, dyes, pigments, softeners, adhesive agents, fillers and/or stabilizers.

The photopolymerizable compositions of the invention are preferred for use in the form of light sensitive layers on a support, that is, in the form of an image recording material. Suitable supports are, for example, paper, metallic supports, metal clad supports, glass, ceramic supports or synthetic resin films, for example, of polyethylene, polycarbonate, polyamide or polyester. The photopolymerizable composition is applied onto the support takes place, for example, by spraying, dipping or coating from a solution. The layer thickness is usually 5 to 200 $\mu$m.

The photopolymerizable compositions of the invention are used particularly for the production of resist materials, primarily as layer transfer materials. For this, the photopolymerizable composition is applied on a temporary support, preferably a polyester film, and a removable synthetic resin sheet is laminated on as cover sheet. For the preparation of the resist image, the cover sheet is then removed and the light sensitive layer is laminated onto a permanent support, principally a copper surface. The material is then exposed imagewise and developed; the temporary support can be removed before or after the exposure. Development takes place by washing off the unpolymerized image areas with suitable solutions, such as, for example, aqueous alkali solutions, organic solvents and solvent mixtures respectively or corresponding aqueous solutions, which can also contain surface active agents.

After the developing step, the material is then subjected to a thermal post-treatment. This can be accomplished by heating the material in an electric oven, drying oven or by means of infrared lamps. The temperature and duration of heating depends on the composition of the resist materials used. The materials are generally heated 10 to 60 minutes at 120° to 200° C.

Next, the resist layer thus prepared can be processed further in the usual manner using known electroplating, etching and soldering methods, without the resist being delaminated or underplating occurring. The photopolymerized layer remaining on the support can be optionally and easily removed by treatment with a conventional stripping solution. Suitable examples for this purpose are strongly alkaline aqueous solutions, which are generally used at increased temperatures between 30 and 90° C. in continuous processing units or tanks, or organic solvents, such as, for example, methylene chloride.

Although the invention was described in the preceding specification as preferred in its use as layer transfer material for photoresists, it is not limited to this use. It is useful in all instances that depend upon the production of imagewise templates or relief materials of especially high chemical and physical resistance.

The following examples serve to illustrate the invention. All percentages and parts are by weight unless otherwise indicated.

EXAMPLE 1

(A) Preparation of Copolymer Containing Amide and Carboxyl Groups 20 g of a copolymer of methyl methacrylate/styrene/maleic acid anhydride (acid number=115 =20.43 mmoles maleic acid/20 g polymer) were dissolved in 100 ml methylene chloride at room temperature. 1.3 g (=22.47 mmoles) propyl amine in 100 ml methylene chloride were added to the polymer solution. The temperature increased to 25° C. After 4 hours of stirring at room temperature, the polymer was precipitated by pouring the solution into 1 l petroleum ether (40–60° C.), filtered out and vacuum dried. The IR spectrum showed no carbonyl peaks at 1860 cm$^{-1}$ and 1780 cm$^{-1}$.

(B) Preparation of a Dry Resist Film

The following coating solution was prepared:
44 ml methylene chloride
6.7 ml methanol
9.14 g of the polymer prepared under (A)
6.10 g of a copolymer of methyl methacrylate/ethyl acrylate/acrylic acid, acid number=80, molecular weight=30,000, $T_g$=50° C.
5 75 g 3-(4-hydroxybenzoyloxy-)-2-hydroxy-propyl methacrylate
2.96 g trimethylol propane triacrylate
4.23 g polyoxyethylated trimethylol propane triacrylate, molecular weight=1162 20 moles ethylene oxide
2.01 g benzil dimethyl ketal
0.17 g diethanol amine
3.59 g Aerosil 200, silica: SiO$_2$ content >99.8%, surface according to BET 200 m2/g, primary particle size 12 mm
28 mg Nile blue (C.I. 51180)

The coating solution was applied on a 25 μm thick polyester film, so that a dry layer thickness of 42 g/m$^2$ was achieved.

(C) Use of Dry Resist Film Prepared Under (B)

The dry resist film prepared under (B) was laminated at 2.0 m/min and 110° C. on a base clad with a 35 μm copper overlay, exposed through an electroplating transparency at 50 mj/cm$^2$ and developed with a 1% Na$^2$CO$_3$ solution at 30° C. in a continuous processor. Clearing time was 25 sec. The developed board was processed without thermal treatment in a Lea Ronal Aurol MRC gold bath at a current amperage of 1A/dm$^2$. After 6 minutes, corresponding to an electrodeposition of less than 2 μm gold, delamination of the resist and heavy underplating was observed. However, if a board as developed above was thermally treated for 5 minutes at 150° C., an electrodeposit of greater than 6 μm gold was achieved after 18 minutes, without delamination of the resist or underplating.

Both boards could then be stripped flawlessly and cleanly in 3% KOH at 50° C.:

|  | Stripping Time |
| --- | --- |
| (a) without thermal treatment | 25 sec |
| (b) with thermal treatment | 35 sec |

EXAMPLE 2

(A) Preparation of Polymer 20 g (=20.43 mmol maleic acid) of the copolymer of Example 1A were dissolved in 300 ml methylene chloride at room temperature. 1.53 g (=20.4 mmol) 1-amino-2-propanol were dissolved in 50 ml methylene chloride and added dropwise with stirring into the polymer solution. The temperature rose to 27° C. After 4 hours reaction time, the polymer was precipitated by pouring into 2.5 l petroleum ether (40°-60° C.), filtered out and vacuum dried. No carbonyl curves were found in the IR spectrum at 1860 cm$^{-1}$ and 1780 cm$^{-1}$.

(B) Preparation of Dry Resist Film

The following coating solution was prepared:
44 ml methylene chloride
6.7 ml methanol
7.61 g of polymer prepared under A)
7.61 g of a copolymer of methyl methacrylate/ethyl acrylate/acrylic acid, acid number=80, molecular weight=30,000, $T_g$=50° C.
5.75 g 3-(4-hydroxybenzoyloxy-)-2-hydroxypropyl methacrylate
7.19 g trimethylol propane triacrylate
2.01 g benzil dimethykl ketal
0.17 g diethanol amine
3.33 g Aerosil 200, silica: SiO$_2$ content >99.8%, surface according to BET 200 m$^2$/g, primary particle size 12 mm
mg Nile blue (C.I. 51180)

The preparation of dry resist film was performed as in Example 1B.

(C) Use of Dry Resist Film Prepared under (B)

The dry resist film was laminated as in Example 1C onto a copper-clad base, exposed and developed. The developed board was processed without thermal treatment in the gold bath described in Example 1C. Delamination of the resist was observed after 5 minutes (corresponding to less 1 than 2 μm gold deposit).

In contrast, after a thermal treatment for 10 minutes at 150° C., greater than 8 μm gold were deposited after 22 minutes, without delamination of the resist or underplating.

Both boards could then be stripped satisfactorily and cleanly in 3% KOH at 50° C.:

|  | Stripping Time |
| --- | --- |
| (a) without thermal treatment | 30 sec |
| (b) with thermal treatment | 40 sec |

EXAMPLE 3

(A) Preparation of Polymer 100 g (=0.102 moles maleic acid) of the copolymer of Example 1A were dissolved in 500 ml tetrahydrofurane at room temperature. 12 g (=0.11 mole) p-aminophenol were dissolved in 100 ml tetrahydrofurane and added to the polymer solution. It was heated to 40° C. and stirred for 4 hours at this temperature. The polymer was precipitated by pouring the solution into 3 l petroleum ether (40°-60° C.), filtered out and vacuum dried. No carbonyl curves were found in the IR spectrum at 1860 cm$^{-1}$ and 1780 cm$^{-1}$.

(B) Preparation of Dry Resist Film

The following coating solution was prepared:
44 ml methylene chloride
6.7 ml methanol
7.24 g of polymer prepared under A)
7.24 g of a copolymer of methyl methacrylate/ethyl acrylate/acrylic acid, acid number=80, molecular weight'30,000, $T_g=50°$ C.
6.19 g 3-(4-hydroxybenzoyloxy-)-2-hydroxypropyl methacrylate
7.45 g trimethylol propane triacrylate
2.07 g benzil dimethyl ketal
0.17 g hexamethylene diamine
5.4 g Aerosil 200, silica: $SiO_2$ content >99.8%, surface according to BET 200 $m^2/g$, primary particle size 12 mm
28 mg Nile blue (C.I. 51180)
The dry resist film was prepared as in Example 1B.

(C) Use of Dry Resist Film Prepared Under (B)

The dry resist film was processed as in Example 1C. A board thus developed was processed without thermal treatment in the gold bath described in Example 1C. Delamination of the resist was observed after 6 minutes (corresponding to less than 2 μm gold deposit). After a thermal treatment for 10 minutes at 150° C., greater than 6 μm gold were deposited after 18 minutes, without the resist being delaminated or underplating occurring.

Both boards could be stripped cleanly and satisfactorily in 3% KOH solution at 50° C.:

|  | Stripping Time |
| --- | --- |
| (a) without thermal treatment | 25 sec |
| (b) with thermal treatment | 35 sec |

EXAMPLE 4

The following coating solution was prepared. 15.3 of a copolymer of methyl methacrylate/butyl acrylate/itaconic acid anhydride (40/44/16), acid number=160, molecular weight=36,000, Tg=29° C., were dissolved in 44 ml methylene chloride and 6.7 ml methanol. 1.64 g isopropanol amine were added and stirred one hour. The following were added to this solution:
5 g 3-(4-hydroxybenzoyloxy-)-2-hydroxypropyl methacrylate
2.93 g trimethyl propane triacrylate
4.88 g polyoxyethylated trimethylol propane triacrylate, molecular weight=1162 20 moles ethylene oxide
2 g benzil dimethyl ketal
0.17 g diethanol amine
3.28 g Aerosil 200, silica:$SiO_2$ content >99.8%, surface according to BET 200 $m^2/g$, primary particle size 12 mm
28 mg Nile blue (C.I. 51180)

A dry resist film with a coating weight of 42 $g/m^2$ was prepared from this coating solution as in Example 1. The dry resist film was laminated as in Example 1C, exposed with 50 $mj/cm^2$ and developed in 1% $Na_2CO_3$ solution at 30° C. The clearing time was 20 seconds.

A board thus developed was processed without thermal treatment in the gold bath described in Example 1C. Delamination of the resist was observed after 6 minutes (corresponding to less than 2 μm gold deposit). After a thermal treatment for 10 minutes at 150° C., greater than 7 μm gold were deposited after 20 minutes, without delamination of the resist or underplating.

Both boards could be stripped satisfactorily and cleanly in 3% KOH solution at 55° C.:

|  | Stripping Time |
| --- | --- |
| (a) without thermal treatment | 30 sec |
| (b) with thermal treatment | 50 sec |

EXAMPLE 5

The following coating solution was prepared:
44 ml methylene chloride
6.7 ml methanol
21.0 g of a copolymer of methyl methacrylate/styrene/maleic acid anhydride, acid number=115, molecular weight=30,000
1.24 g isopropyl amine
This solution was stirred 1 hour. Then the following were added:
10.09 g polyoxyethylated trimethylol propane triacrylate, molecular weight=1162 20 moles ethylene oxide
2.1 g polypropylene glycol-420-diacrylate
1.4 g benzophenone
0.05 g ethyl Michler's ketone
40 mg Nile blue (C.I. 51180)

The coating solution was applied on a 25 μm thick polyester base with a dry layer weight of 42 $g/m^2$.
The dry resist film was laminated under conventional conditions at 110° C. roller temperature and 2.0 m/min on a base clad with 35 μm copper, exposed through a plating transparency with 60 $mj/cm^2$ and developed in a commercial processor with 1,1,1-trichloroethane.

The dry resist film was processed as in Example 1C. A board thus developed was processed without thermal treatment in the gold bath described in Example 1C. After 8 minutes (corresponding to less than 3 μm gold deposit), delamination of the resist was observed. After a thermal treatment of 10 minutes at 150°C., greater than 8 μm gold wer deposited awfter 22 minutes without delamination of the resist or underplating.

Both boards could be stripped satisfactorily and cleanly in methylene chloride/methanol (95/5).

EXAMPLE 6

The following coating solutions were prepared:

|  | A | B |
| --- | --- | --- |
| Methylene chloride | 216 g | 216 g |
| Methanol | 11 g | 11 g |
| Copolymers of Example 1A | 50 g | — g |
| Copolymer of ethyl methacrylate/ethyl acrylate/methacrylic acid (29/60/11), acid number = 80, $T_g = 35°$ C. | — g | 50 g |
| Pentaerythritol tetraacrylate | 40 g | 40 g |
| Benzophenone | 4 g | 4 g |
| Ethyl Michler's ketone | 0.2 g | 0.2 g |
| 3-mercapto-1,2,4-triazole | 0.2 g | 0.2 g |
| Jeffamine D 230[1] | 10 g | 10 g |
| m-TMI[2] | 7.5 g | 7.5 g |

-continued

|  | A | B |
|---|---|---|
| Dayglo 122-9693[3] | 5 g | 5 g |

[1] = 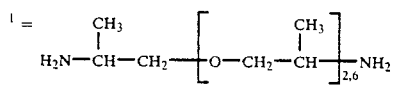

[2] = 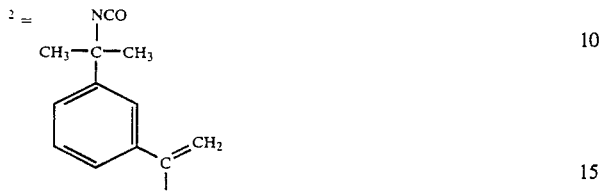

[3] = green pigment

The coating solutions were applied onto a 25 μm thick polyester film, so that a dry film thickness of 50 μm was attained.

The dry resist films A and B were laminated on a COMB circuit line sample corresponding to IPC-SM 840A, which were sprayed first with tripropylene glycol diacrylate.

Both boards were exposed in each case with 80 mj/cm² through the corresponding test transparency and developed with a 1% Na$_2$CO$_3$ solution at 30° C..

Both boards were treated after development for one hour each at 150° C. and then exposed with 4 mj/cm². Measurement of the moisture and insulation properties was conducted under IPC Class III test conditions. The following resistances were measured:

| Formulation A | 1 × 10$^9$ Ω |
|---|---|
| Formulation B | 6 × 10$^7$ Ω |

What is claimed is:

1. A photopolymerizable composition for image recording comprising
   (a) at least one addition-polymerizable, ethylenically unsaturated compound,
   (b) a photoinitiator or a photoinitiator system and
   (c) at least one copolymeric binder containing one or more structural units A and B and at least one additional structural unit C1 or C2 containing carboxyl groups, characterized in that
   (I) 5 to 50 percent by weight of the copolymer is formed from one or more different structural units C1, C2 or combinations thereof containing carboxyl groups
   (II) the proportion of one or more different structural units A is 5 to 95 percent by weight,
   (III) the proportion of one or more different structural units B is 0 to 50 percent by weight and
   (IV) A, B, C1 and C2 have the structures

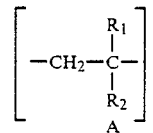

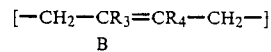

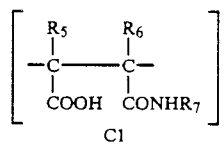

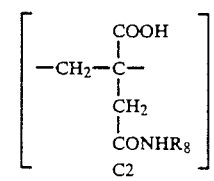

in which
   $R_1$ = H, CH$_3$, C$_2$H$_5$, phenyl and alkylphenyl,
   $R_2$ = H, CH$_3$, phenyl, —COOR$_9$, —CONR$_{10}$R$_{11}$ and —CN,
   $R_3$, $R_4$, $R_5$, and $R_6$ = H and alkyl and
   $R_7$, $R_8$, $R_9$, $R_{10}$ and $R_{11}$ = H, alkyl and aryl, which is unsubstituted or substituted with one or more hydroxy, ester, halogen, keto, ether or thioether groups.

2. A photopolymerizable composition in accordance with claim 1 characterized in that the specified copolymer is present as the only binder.

3. A photopolymerizable composition in accordance with claim 1 characterized in that the specified copolymer is the reaction product of a copolymer formed from one or more ethylenically unsaturated dicarboxylic acid anhydrides and one or more ethylenically unsaturated compounds with primary amine.

4. A photopolymerizable composition in accordance with claim 3 characterized in that maleic acid anhydride, itaconic acid anhydride or citraconic acid anhydride is used as an ethylenically unsaturated dicarboxylic acid anhydride.

5. A photopolymerizable composition in accordance with claim 3 characterized in that unsubstituted or hydroxy substituted alkyl or aryl amine is used.

6. A photopolymerizable composition for image recording in accordance with claim 3 characterized in that one or more of styrene, isoprene, butadiene, (meth)acrylic acid, (meth)acrylamides or (meth)acrylates is used as comonomer.

7. A photopolymerizable composition in accordance with claim 1 characterized in the form of a solid, transferable layer on a support of synthetic resin film.

8. A photopolymerizable composition in accordance with claim 1 characterized in the form of a solid layer on a metallic support or a metal-clad support.

* * * * *